(12) United States Patent
Jin et al.

(10) Patent No.: US 9,941,032 B2
(45) Date of Patent: Apr. 10, 2018

(54) LOW-RESISTANCE CONNECTION BODY FOR HIGH-TEMPERATURE SUPERCONDUCTING WIRE MATERIAL AND CONNECTION METHOD

(71) Applicant: RIKEN, Saitama (JP)

(72) Inventors: Xinzhe Jin, Yokohama (JP); Hideaki Maeda, Yokohama (JP); Yoshinori Yanagisawa, Ichikawa (JP)

(73) Assignee: Riken, Saitama (JP)

( * ) Notice: Subject to any disclaimer, the term of this patent is extended or adjusted under 35 U.S.C. 154(b) by 0 days.

(21) Appl. No.: 15/116,432

(22) PCT Filed: Oct. 21, 2014

(86) PCT No.: PCT/JP2014/077966
§ 371 (c)(1),
(2) Date: Aug. 3, 2016

(87) PCT Pub. No.: WO2015/118732
PCT Pub. Date: Aug. 13, 2015

(65) Prior Publication Data
US 2017/0011823 A1    Jan. 12, 2017

(30) Foreign Application Priority Data

Feb. 4, 2014 (JP) ................................. 2014-019034

(51) Int. Cl.
*H01L 39/24* (2006.01)
*H01B 12/04* (2006.01)
(Continued)

(52) U.S. Cl.
CPC ............... *H01B 12/04* (2013.01); *H01F 6/06* (2013.01); *H01L 39/02* (2013.01); *H01R 4/68* (2013.01); *H01R 43/02* (2013.01)

(58) Field of Classification Search
CPC .. H01B 12/04; H01F 6/06; H01R 4/68; H01R 43/02
(Continued)

(56) References Cited

U.S. PATENT DOCUMENTS

| 5,786,304 A | 7/1998 | Kimura et al. |
| 2010/0210468 A1 | 8/2010 | Lee et al. |

FOREIGN PATENT DOCUMENTS

| JP | H0640775 | 2/1994 |
| JP | 2000133067 | 5/2000 |
| JP | 2011515792 | 5/2011 |

OTHER PUBLICATIONS

Machine translation of JP 2000-133067 (2000).*
(Continued)

*Primary Examiner* — Paul Wartalowicz
(74) *Attorney, Agent, or Firm* — Patent Law Works LLP

(57) ABSTRACT

Provided is a low-resistance connection body for a high-temperature superconducting wire, in which a high-temperature superconducting bulk body and a high-temperature superconducting wire including a high-temperature superconducting layer are connected to each other, wherein a melting point of the high-temperature superconducting layer is higher than a melting point of the high-temperature superconducting bulk body; the high-temperature superconducting layer and the high-temperature superconducting bulk body are in contact at a connection site of the high-temperature superconducting wire and the high-temperature superconducting bulk body; and a surface of the high-temperature superconducting bulk body that is in contact with the high-temperature superconducting layer is crystallized due to crystal growth. Two high-temperature superconducting wires can be connected, with low resistance, through connection of the two high-temperature superconducting wires to one high-temperature superconducting bulk.

12 Claims, 10 Drawing Sheets

(51) Int. Cl.
*H01R 4/68* (2006.01)
*H01R 43/02* (2006.01)
*H01L 39/02* (2006.01)
*H01F 6/06* (2006.01)

(58) Field of Classification Search
USPC .................................... 505/234, 925, 926
See application file for complete search history.

(56) References Cited

OTHER PUBLICATIONS

Machine translation of JP H0640775 (1992).*
International Search Report for International Application No. PCT/JP2014/077966, dated Jan. 27, 2015, 2 pgs.

* cited by examiner

[Fig. 1]
(a)
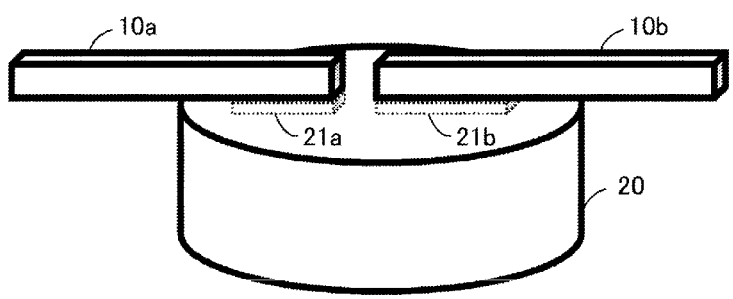
(b)
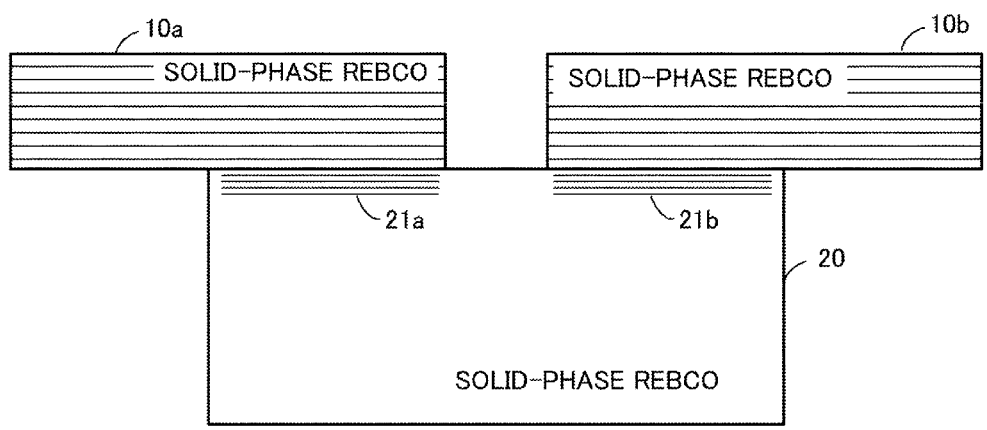

[Fig. 2]
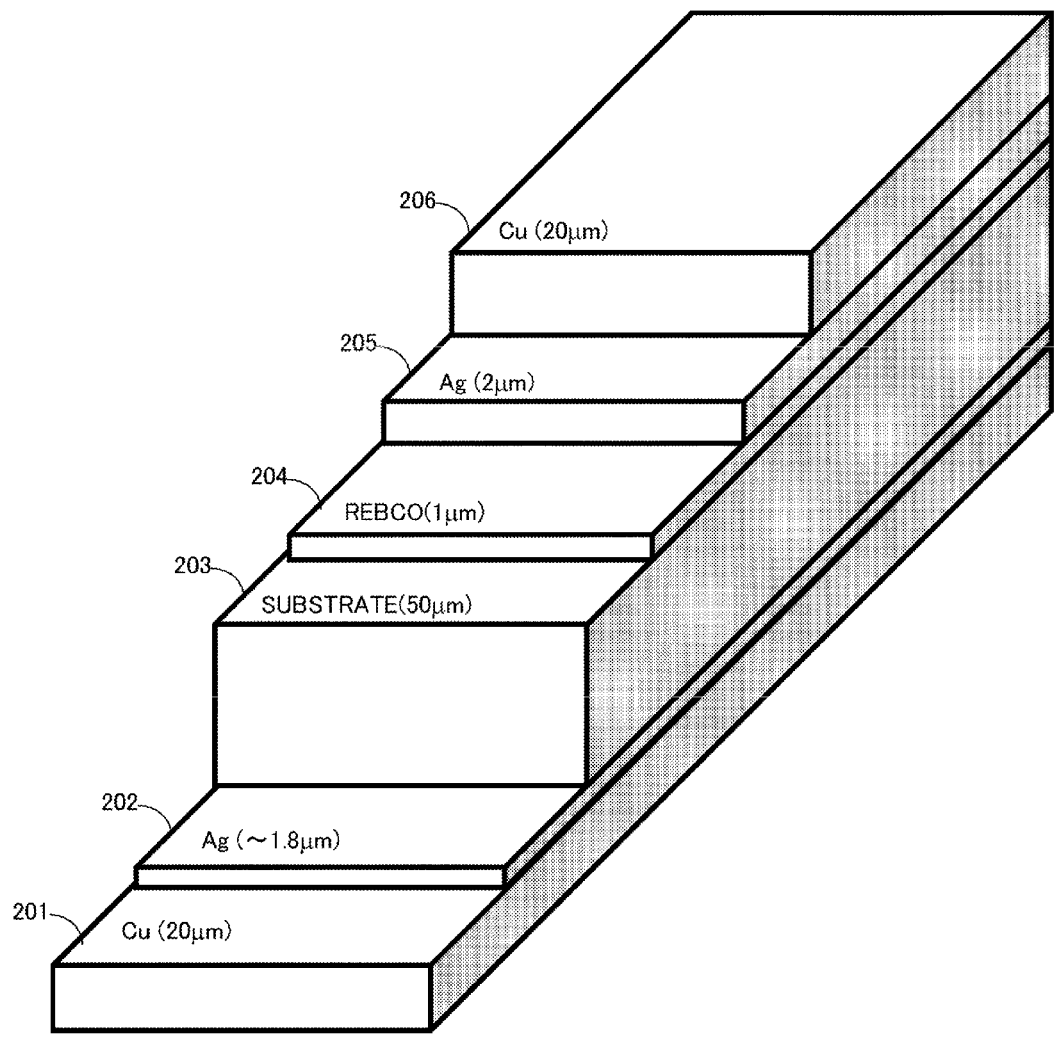

[Fig. 3]
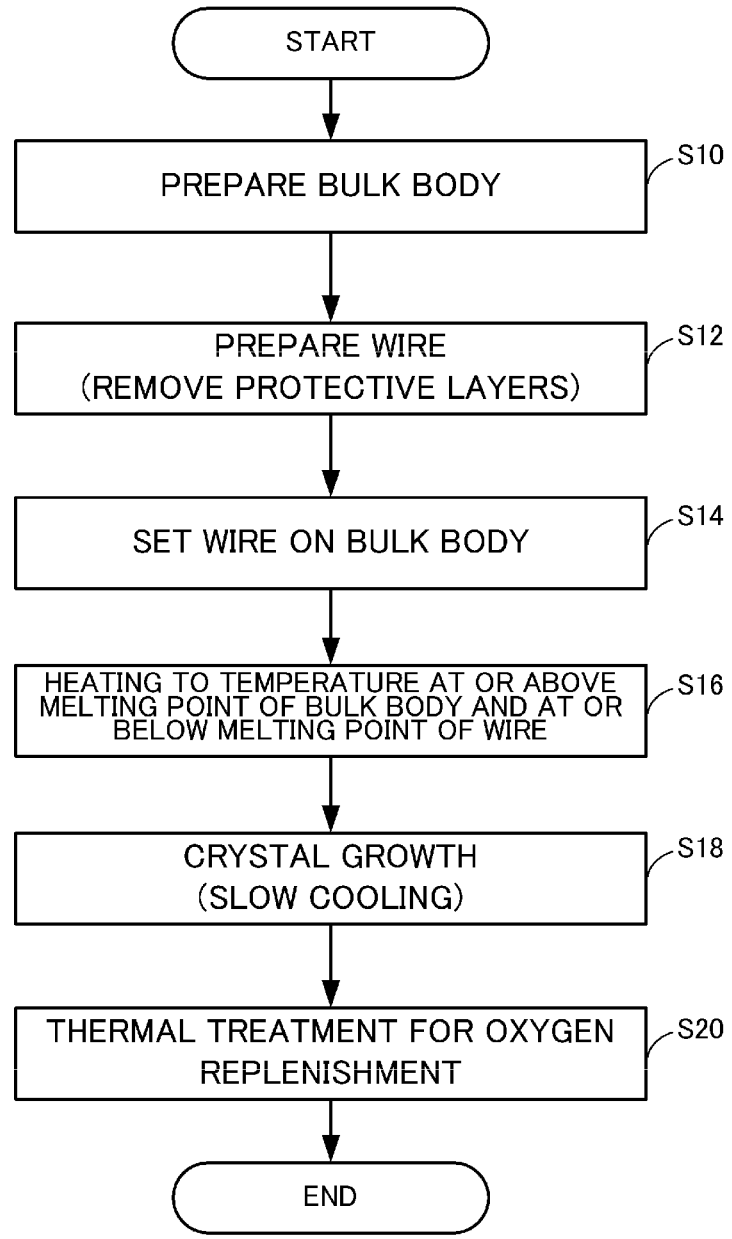

[Fig. 4]
(a) EMBODIMENT 1: FRONT-VIEW DIAGRAM
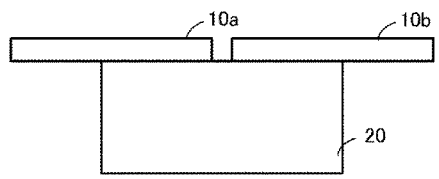
(b) EMBODIMENT 1: TOP-VIEW DIAGRAM
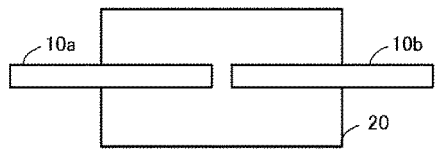
(c) VARIATION 1 OF EMBODIMENT 1: TOP-VIEW DIAGRAM
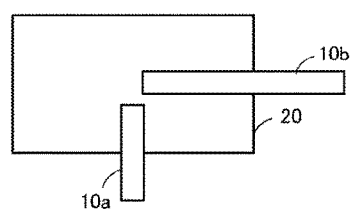
(d) VARIATION 2 OF EMBODIMENT 1: TOP-VIEW DIAGRAM
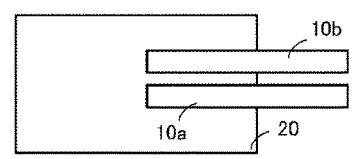
(e) EMBODIMENT 2: FRONT-VIEW DIAGRAM
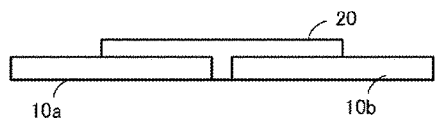
(f) EMBODIMENT 2: TOP-VIEW DIAGRAM
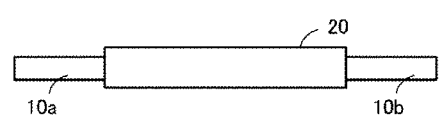
(g) EMBODIMENT 3: FRONT-VIEW DIAGRAM
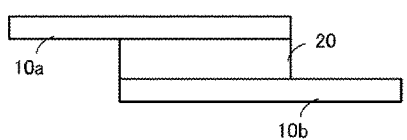
(h) EMBODIMENT 3: SIDE-VIEW DIAGRAM
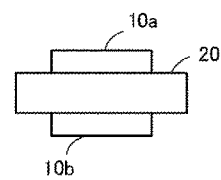

[Fig. 5]
(a) BULK BODY SUPPORT SUBSTRATES (BOTTOM-VIEW DIAGRAM)
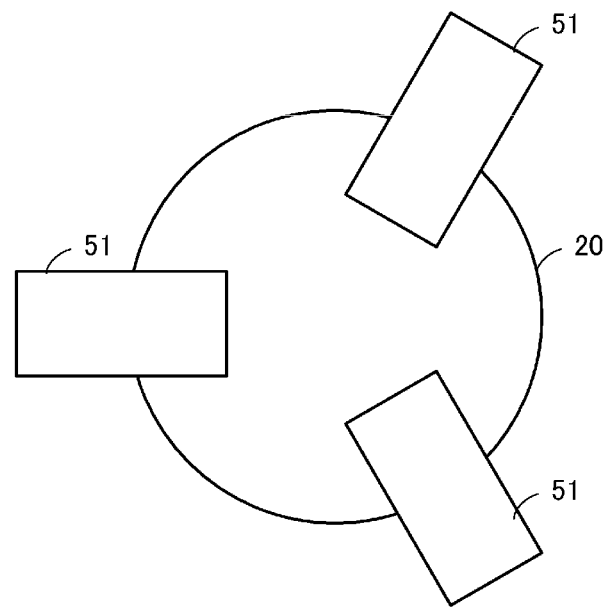
(b) WIRE SUPPORT SUBSTRATES (FRONT-VIEW DIAGRAM)
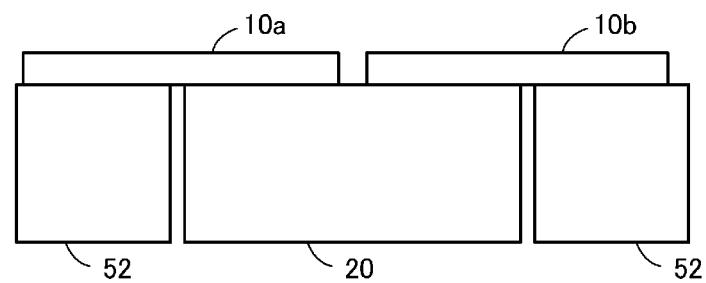

[Fig. 6]
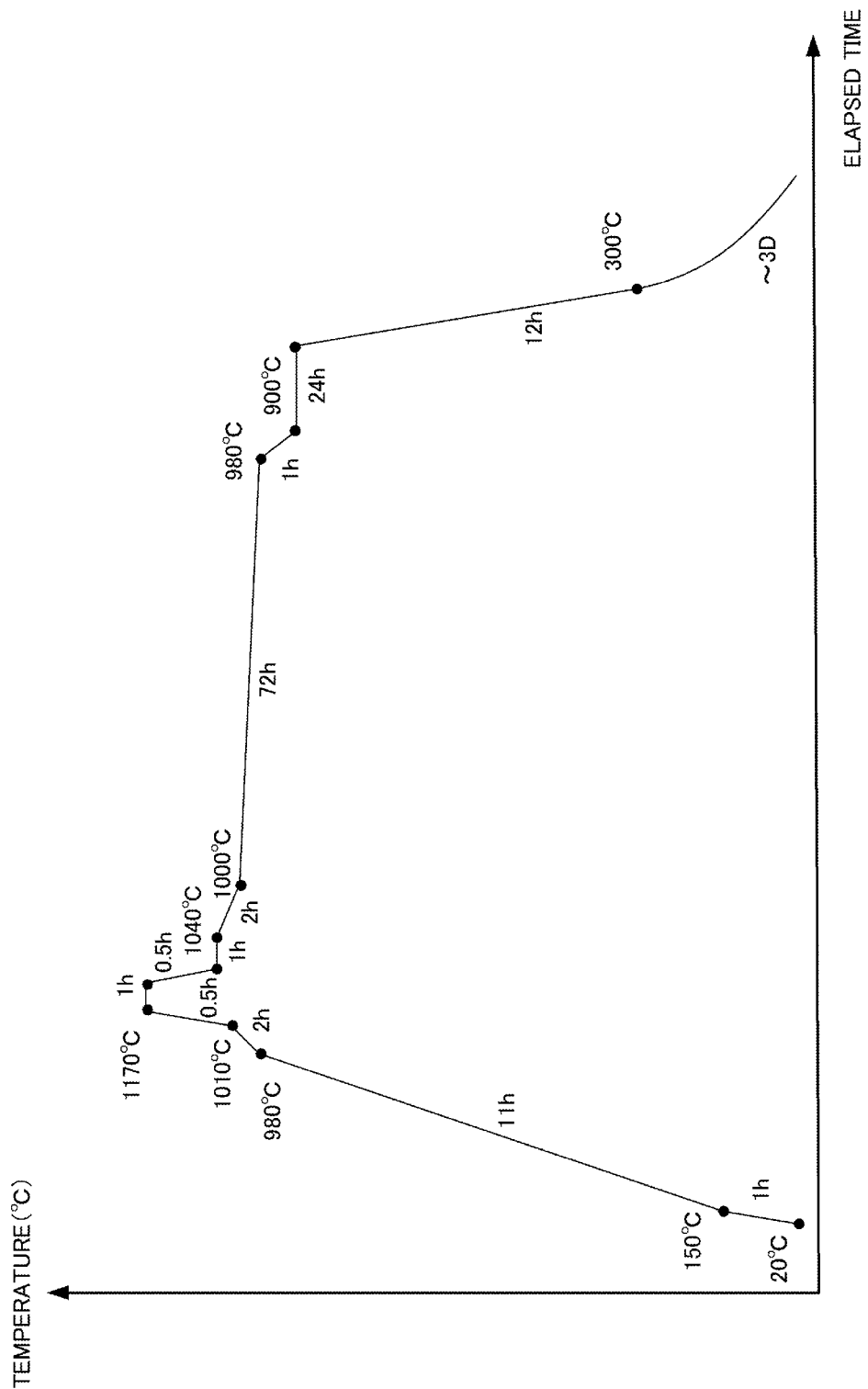

[Fig. 7]
(a)
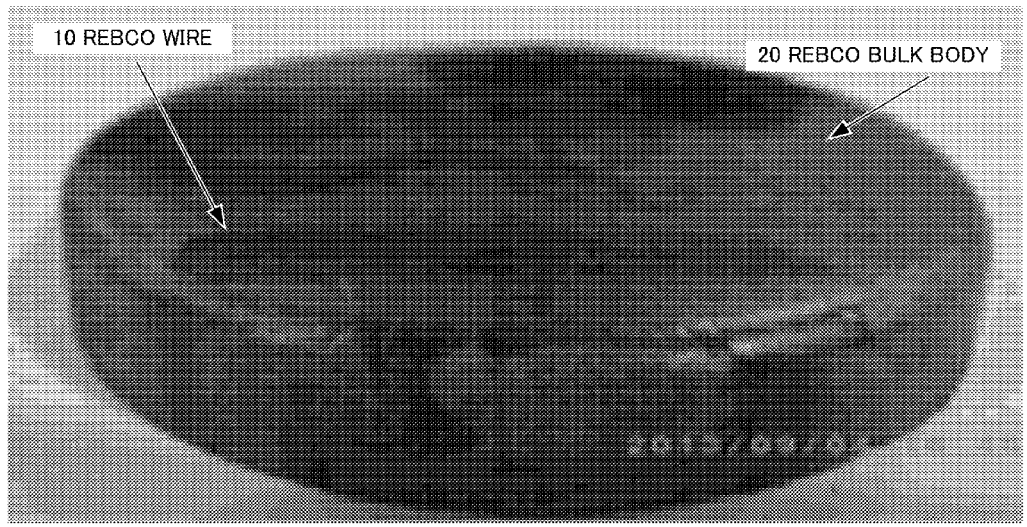
(b)
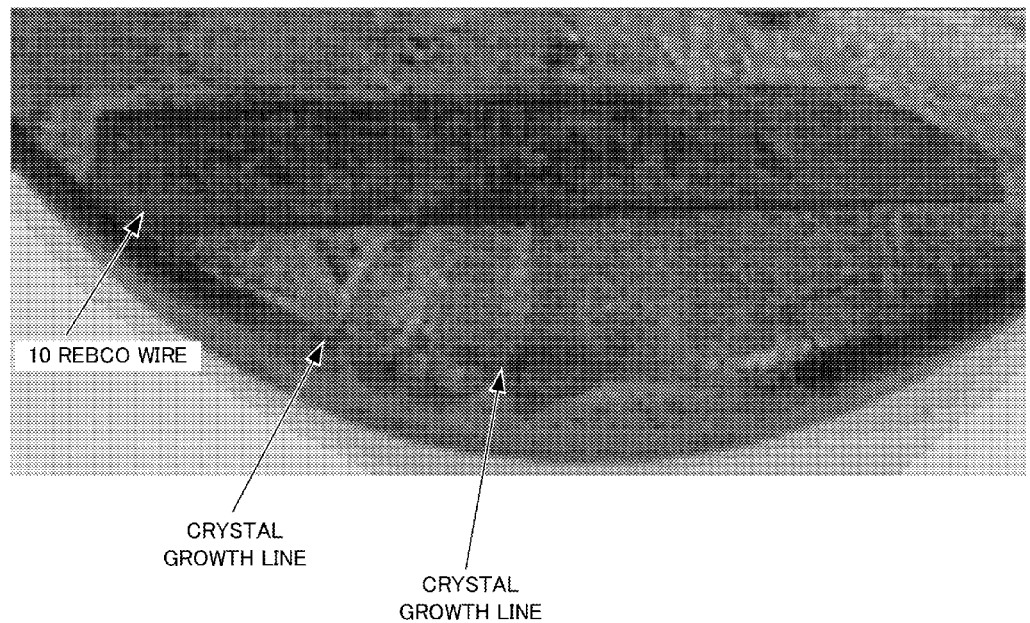

[Fig. 8]
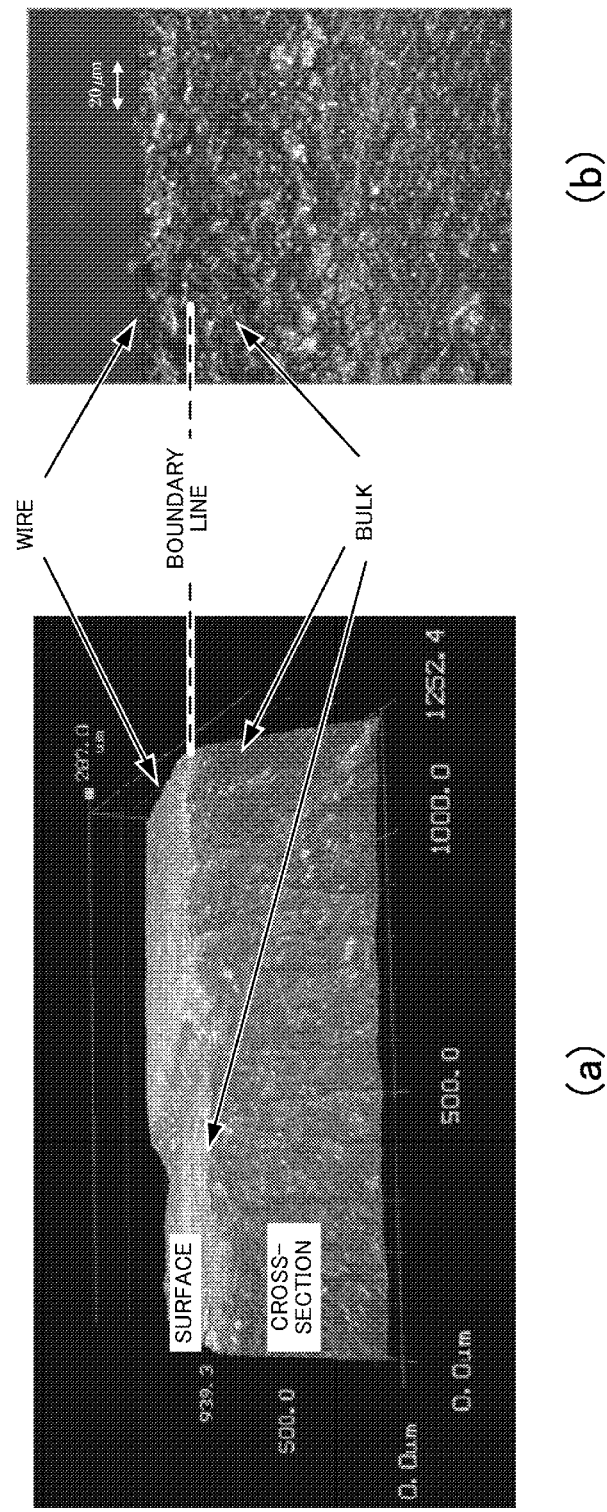

[Fig. 9]
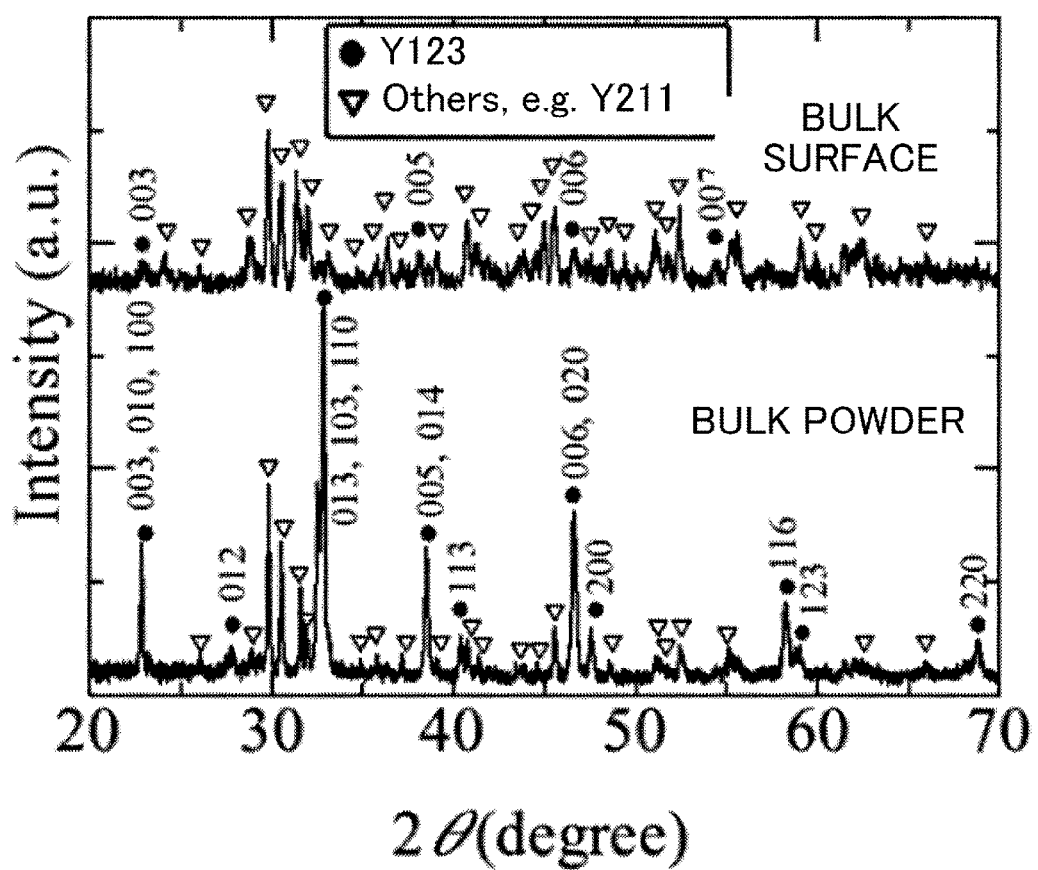

[Fig. 10]
(a)
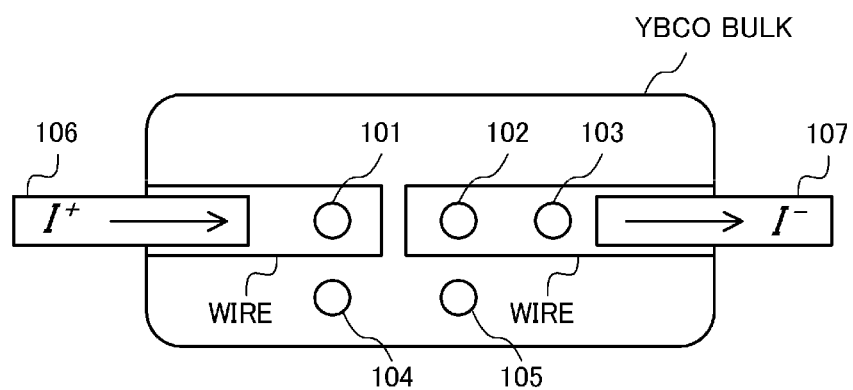
(b)
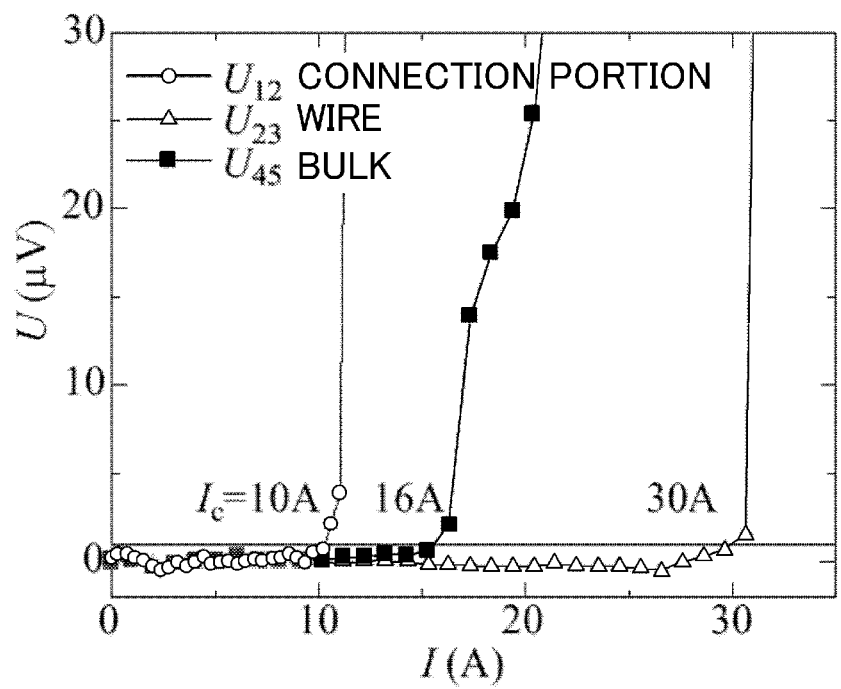

LOW-RESISTANCE CONNECTION BODY FOR HIGH-TEMPERATURE SUPERCONDUCTING WIRE MATERIAL AND CONNECTION METHOD

TECHNICAL FIELD

The present invention relates to a technology for low-resistance connection of high-temperature superconducting wires.

BACKGROUND ART

Superconducting wires are widely used for instance in NMR (Nuclear Magnetic Resonance) devices and MRI (Magnetic Resonance Imaging) devices. Rare earth-based high-temperature superconducting wires (REBCO superconducting wires) have been produced in recent years, and research and development is being conducted in which such superconducting wires are utilized.

Joining of superconducting wires to each other is an essential technical issue with a view for instance to achieving longer wires and realizing a persistent current mode. Low-resistance connection between REBCO superconducting wires is conventionally accomplished by soldering; as is known, however, electrical resistance values of about $10^{-8}\Omega$ are incurred in this technique.

Research has been carried out in recent years for directly joining REBCO superconducting wires to each other. PTL 1 proposes a technique relying on a melt diffusion method. In this technique, the protective layers of two REBCO superconducting wires are removed, and the wires are heated up to the melting point of superconducting layers, while causing the superconducting layers to abut each other and while applying pressure to the latter; thereby, part of the abutting superconducting layers in the thickness direction undergoes melt diffusion, and the superconducting wires become joined to each other as a result. PTL 1 reports that the REBCO superconducting wires can be connected to each other with yet lower resistance than is the case when the wires are joined by soldering.

CITATION LIST

Patent Literature

[PTL 1] Japanese Translation of PCT Application No. 2011-515792

SUMMARY OF INVENTION

Technical Problem

The technique of PTL 1, however, has several problems. The thickness of the superconducting layers of the REBCO superconducting wires is of about 1 to 2 µm; therefore, as a first problem, it is difficult to control the temperature of partial heating in the thickness direction, and mechanical strength after joining is insufficient. As a second problem, crystal orientations at the junction surface are not aligned, as a result of which critical current becomes lower and wire performance poorer. Thirdly, connection to one connection body in a joining process requires a long time, ordinarily of several months, taking into consideration connection success rates.

In the light of the above issues, it is an object of the present invention to provide a technique that allows connecting high-temperature superconducting wires in a simpler manner and with better performance than in conventional techniques.

Solution to Problem

In order to attain the above goal, the low-resistance connection body for a high-temperature superconducting wire according to the present invention is a connection body that connects a high-temperature superconducting bulk body and a high-temperature superconducting wire including a high-temperature superconducting layer, wherein the high-temperature superconducting layer of the high-temperature superconducting wire and the high-temperature superconducting bulk body are in contact at a connection site of the high-temperature superconducting wire and the high-temperature superconducting bulk body, and a surface of the high-temperature superconducting bulk body that is in contact with the high-temperature superconducting layer is crystallized due to crystal growth. Herein the term crystal growth does not denote crystal growth for the bulk, but denotes crystalline connection at the connecting portion between the wire and the bulk, including linkages at the atomic level. For instance the term encompasses connection due to crystal growth, regardless of whether crystal growth takes place in the bulk as a whole or not, so long as a polycrystalline bulk melts and becomes connected to an oriented high-temperature superconducting layer in the wire.

The high-temperature superconducting layer of the high-temperature superconducting wire of the present invention is a single crystal, or an oriented polycrystal, or an oriented composite material, of a high-temperature superconducting material, and has preferably a wire-like shape or tape-like shape the thickness of which is typically of 10 µm or less (more preferably 1 µm or less). The high-temperature superconducting wire may be a composite wire that includes for instance a substrate and a stabilizing layer, besides the high-temperature superconducting layer. The high-temperature superconducting bulk body in the present invention is a polycrystal or single crystal of a high-temperature superconducting material. The shape of the high-temperature superconducting bulk body is not particularly limited, but the thickness is preferably 1 mm or greater.

In the present invention, the high-temperature superconducting layer of the high-temperature superconducting wire is preferably a rare earth-based superconducting material represented by $REBa_2Cu_3O_{7-\delta}$ (where, RE is one or a plurality of rare earth elements). Similarly, the high-temperature superconducting bulk body is preferably a rare earth-based superconducting material represented by $RE'Ba_2Cu_3O_{7-\delta}$ (where, RE' is one or a plurality of rare earth elements, the element or composition being different from that of RE).

In the present invention, preferably, the melting point of the high-temperature superconducting layer of the high-temperature superconducting wire is higher than the melting point of the high-temperature superconducting bulk body. That is because in this case the high-temperature superconducting bulk body can undergo crystal growth, using the high-temperature superconducting layer as a seed crystal, through heating up to a temperature at which only the high-temperature superconducting bulk body liquefies, and by bringing about a state in which the liquid-phase high-temperature superconducting bulk body and the solid-phase high-temperature superconducting layer are brought into contact with each other.

The high-temperature superconducting layer of the high-temperature superconducting wire and the high-temperature superconducting bulk body are compounds having identical crystal structures at normal temperature and in which one or a plurality of elements are substituted; therefore, the superconducting layer and the superconducting bulk body share sites and thus crystal growth of the high-temperature superconducting bulk body can be accomplished using the solid-phase high-temperature superconducting layer as a seed crystal.

In the present invention, the crystal orientations of the high-temperature superconducting layer and of the high-temperature superconducting bulk body are aligned at a connection surface, and hence the critical current becomes larger. Further, the mechanical strength of the connection is enhanced to a sufficient level in practice. Moreover, the time required for the connection process can be made into a relatively short time, from about 1 day to about 1 week.

By connecting two high-temperature superconducting wires via one high-temperature superconducting bulk body, as described above, it becomes possible to connect two high-temperature superconducting wires, with low resistance, via the high-temperature superconducting bulk body. Specifically, one aspect of the present invention is a low-resistance connection body for a high-temperature superconducting wire, in which a first high-temperature superconducting wire including a first high-temperature superconducting layer and a second high-temperature superconducting wire including a second high-temperature superconducting layer are connected to each other via a high-temperature superconducting bulk body, wherein the first and second high-temperature superconducting layers and the high-temperature superconducting bulk body are in contact at connection sites of the first and second high-temperature superconducting wires and the high-temperature superconducting bulk body; and surfaces of the high-temperature superconducting bulk body that are in contact with the first and second high-temperature superconducting layers are crystallized due to crystal growth.

The high-temperature superconducting materials that make up the first and second high-temperature superconducting layers may be identical or different. Preferably, for instance the first high-temperature superconducting layer is made up of $RE^1Ba_2Cu_3O_{7-\delta}$ ($RE^1$ is one or a plurality of rare earth elements), and the second high-temperature superconducting layer is made up of $RE^2Ba_2Cu_3O_{7-\delta}$ (where, $RE^2$ is one or a plurality of rare earth elements), where $RE^1$ and $RE^2$ may be of identical element or composition, or may be of different elements or compositions.

The connection body that connects two high-temperature superconducting wires to one high-temperature superconducting bulk body may adopt various concrete forms. For instance, the two high-temperature superconducting wires may be connected to the same surface of the high-temperature superconducting bulk body, or to different surfaces. The orientations of the connections of the two high-temperature superconducting wires and the high-temperature superconducting bulk body may be identical or different.

The present invention can also be regarded as a low-resistance connection method for a high-temperature superconducting wire. The method according to one aspect of the present invention is a low-resistance connection method for a high-temperature superconducting wire, for connecting a high-temperature superconducting wire including a high-temperature superconducting layer with a high-temperature superconducting bulk body, the melting point of which is lower than that of the high-temperature superconducting layer, the method including: a temperature rise step of heating the high-temperature superconducting bulk body up to a temperature that is equal to or higher than a melting point of the high-temperature superconducting bulk body and lower than a melting point of the high-temperature superconducting layer; and a crystal growth step of performing crystal growth on the high-temperature superconducting bulk body in a state where a liquid phase portion of the high-temperature superconducting bulk body and the high-temperature superconducting layer are in contact with each other.

A further aspect of the present invention is a low-resistance connection method for a high-temperature superconducting wire, for connecting a first high-temperature superconducting wire including a first high-temperature superconducting layer and a second high-temperature superconducting wire including a second high-temperature superconducting layer with a high-temperature superconducting bulk body, the melting point of which is lower than those of the first and second high-temperature superconducting layers, the method including: a temperature rise step of heating the high-temperature superconducting bulk body up to a temperature that is equal to or higher than a melting point of the high-temperature superconducting bulk body and lower than melting points of the first and second high-temperature superconducting layers; and a crystal growth step of performing crystal growth on the high-temperature superconducting bulk body in a state where a liquid phase portion of the high-temperature superconducting bulk body and the first and second high-temperature superconducting layers are in contact with each other.

The present invention can also be regarded as a superconducting coil that utilizes high-temperature superconducting wires connected as described above.

Advantageous Effects of Invention

The present invention allows connecting high-temperature superconducting wires to each other more simply and with better performance than in conventional instances.

BRIEF DESCRIPTION OF DRAWINGS

FIG. 1(a) and FIG. 1(b) are diagrams illustrating an overview of the connection body of superconducting wires according to the present invention.

FIG. 2 is a diagram illustrating the structure of an ordinary high-temperature superconducting wire.

FIG. 3 is a diagram illustrating the flow of a connection process method of high-temperature superconducting wires of the present invention.

FIG. 4(a) to FIG. 4(h) are diagrams illustrating the configuration of connection bodies of superconducting wires according to various embodiments.

FIG. 5(a) and FIG. 5(b) explain respectively bulk body support substrates and wire support substrates in a thermal treatment step.

FIG. 6 is a diagram illustrating a temperature profile used in examples.

FIG. 7(a) and FIG. 7(b) are diagrams illustrating connection bodies of superconducting wires produced in examples.

FIG. 8(a) is a diagram illustrating the surface and cross-section of a connecting portion, and FIG. 8(b) is an enlarged-view diagram of the cross-section of the connecting portion.

FIG. 9 is a diagram illustrating X-ray diffraction measurement results.

FIG. 10(a) is a diagram for explaining a method for measuring electrical resistance, and FIG. 10(b) is a diagram illustrating measurement results of electrical resistance.

DESCRIPTION OF EMBODIMENTS

Modes for carrying out the present invention will be exemplarily explained next in detail on the basis of working examples, with reference to accompanying drawings. Unless otherwise stated, the scope of the invention is not limited by the dimensions, materials and shapes of the constituent parts, relative arrangement between the constituent parts, and or features described in the following working examples.

<Overview>

FIG. 1(a) and FIG. 1(b) are diagrams illustrating an overview of connection between REBCO wires of the present embodiment. As illustrated in the figures, two REBCO wires 10a, 10b are connected by way of a REBCO bulk body 20 as an intermediate medium. A material having a lower melting point lower than that of the REBCO wires 10a, 10b is used herein as the REBCO bulk body 20; the REBCO wires 10a, 10b and the REBCO bulk body 20 become connected due to crystal growth at contact surfaces 21a, 21b of the REBCO wires 10a, 10b and the REBCO bulk body 20. Herein a REBCO wire (a high-temperature superconducting wire) is generally a composite wire having for instance a REBCO layer (high-temperature superconducting layer) and, in addition, a stabilizing layer, a substrate and so forth (see FIG. 2). FIG. 1(a) and FIG. 1(b) illustrate only the portion of the REBCO layers, as the respective REBCO wires 10a, 10b. So long as the two REBCO layers are in direct contact at the connection portions of the REBCO bulk body, the REBCO wires may have a stabilizing layer, a substrate and so forth at portions other than the connection portions. As described below, the thickness of REBCO layers is generally of 1 μm in commercially available REBCO composite wires. Although it is actually the REBCO layers (high-temperature superconducting layers) and the REBCO bulk body (high-temperature superconducting bulk body) of a REBCO wire that are connected in the connection according to the present embodiment, such a connection will also be referred to herein as connection between the REBCO wires and the REBCO bulk body.

The REBCO bulk body 20 undergoes crystal growth using the REBCO layers of the REBCO wires 10a, 10b as seed crystals, and hence the crystal orientations of the REBCO layers and of the REBCO bulk body are aligned at the junction surfaces. The critical current is therefore enhanced, and yet larger superconducting currents can be caused to flow. Moreover, the mechanical joint strength is very high, and there is obtained a junction adequate for practical use.

Hereafter, the two REBCO wires 10a, 10b will be notated as REBCO wires 10 unless the wires need to be distinguished from each other. To simplify the disclosure, the REBCO wires and REBCO bulk body may also be referred to simply as wires and bulk body.

The REBCO layer of each REBCO wire 10 results from making a rare-earth superconducting material (REBa$_2$Cu$_3$O$_{7-\delta}$) into a tape shape (layer shape). Herein, RE denotes one or a plurality of rare earth elements. Rare earth element include Sc, Y, La, Ce, Pr, Nd, Pm, Sm, Eu, Gd, Tb, Dy, Ho, Er, Tm, Yb and Lu. As described below, the REBCO bulk body 20 undergoes crystal growth and hence the melting point of the REBCO layer must be higher than the melting point of the REBCO bulk body 20. Generally REBCO wires having a REBCO layer that utilizes Gd or Y, or Gd and Y, are commercially distributed. In particular, Gd has a relatively high melting point of about 1050° C. to 1100° C., and is therefore a preferred material. The REBCO layer of the REBCO wire 10a and the REBCO layer of the REBCO wire 10b may be made up of different rare earth superconducting materials.

REBCO wires that are generally commercially available have a multilayer structure made up of a plurality of materials for the purpose of mechanical reinforcement and electrical protection. FIG. 2 illustrates the structure of a REBCO wire. As illustrated in the figure, the REBCO wire has, from the bottom layer upwards, a copper stabilizing layer 201 (20 μm), a silver stabilizing layer 202 (up to 1.8 μm), a substrate 203 (50 μm), an interlayer ((not shown) up to 0.2 μm), a REBCO layer 204 (1 μm), a silver stabilizing layer 205 (2 μm) and a copper stabilizing layer 206 (20 μm). The REBCO layer of the REBCO wire corresponds to the high-temperature superconducting layer of the present invention.

In order to join a REBCO wire 10 to the REBCO bulk body 20, the REBCO layer 204 must be brought into contact with the bulk body 20. Therefore, a pretreatment is required for stripping the protective layers and substrate, to expose the REBCO layer 204. Since high-temperature firing is performed in the joining process, it is necessary to remove materials having a melting point equal to or lower than the firing temperature. The firing temperature is determined depending on the melting point of the bulk body 20, but is 700° C. or higher. Therefore, solder needs to be removed in a case where solder is used in the wire. Silver and silver alloys (melting point of about 900° C.) are preferably removed in a case where the firing temperature exceeds 900° C. Methods for removing these materials will be explained in detail further on.

The REBCO bulk body 20 is made up of a rare-earth superconducting material (RE'Ba$_2$Cu$_3$O$_{7-\delta}$), like the superconducting layers of the wires 10; however, the REBCO bulk body 20 is a bulk body, not a wire. Herein, RE' denotes one or a plurality of rare earth elements (Sc, Y, La, Ce, Pr, Nd, Pm, Sm, Eu, Gd, Tb, Dy, Ho, Er, Tm, Yb and Lu), the element or composition being different from that of RE of the REBCO layer of the REBCO wires 10. The melting point of the bulk body 20 must be lower than the melting point of the REBCO layers of the wires 10, at least in the firing process. The lower the melting point of the bulk body 20, the more the firing temperature can be lowered; hence, the melting point of the bulk body 20 is preferably low. Therefore, the rare earth element in the bulk body 20 has preferably, as a main component, Y, Yb, Er, Ho or the like having a low melting point.

The lower the content of oxygen in the chemical formula REBa$_2$Cu$_3$O$_{7-\delta}$ of REBCO, the lower becomes the melting point. Therefore, it is preferable to use a bulk body having oxygen content as low as possible, within a range that allows preserving the original crystal structure, in order to produce a connection body at a lower temperature. Specifically, the oxygen content of the bulk body 20 before the firing process lies preferably in the range of 3% to 8%, more preferably in the range of 5% to 6.5%.

Preferably, the critical current of the bulk body 20 is higher than that of the wires 10 in the connection body that is finally produced. Therefore, the crystal growth process is followed by a thermal treatment for oxygen replenishment, to increase thereby the oxygen content and enhance the superconducting performance.

Within the surface of the REBCO bulk body 20, at least the surfaces 21a, 21b of contact with the REBCO layers of the REBCO wires 10a, 10b is crystallized due to crystal growth. It is not necessary herein to grow the entirety of the bulk body to a perfect single crystal, and it suffices that just the contact surfaces 21a, 21b become single crystals, while other portions may be polycrystalline. It suffices that the single-crystal layer be thick enough so that sufficient connection strength is obtained. For instance, sufficient connection strength is obtained for a thickness of several mm (1 to 5 mm), while a firing time of about 3 hours suffices to obtain about 3 mm of crystal growth.

The critical current in the bulk body 20 is related to the type, purity and shape of the rare earth element contained in the bulk body 20. The rare earth element contained in the bulk body 20 may be of any type. The purity of the bulk body 20 is set to be 30% or higher, preferably 50% or higher, and more preferably 95% or higher. Although it is not difficult to produce a bulk body having a purity of 95% or higher, in some instances normal conducting substances are introduced into commercially available bulk bodies, for the purpose of shape retention during production by heating. The purity of the bulk body may be 30% or higher, but is preferably 50% or higher wherever possible, since electrical conductivity varies depending on the purity of the bulk body. The critical current can be increased through adjustment of the thickness of the bulk body 20 (length in the direction perpendicular to the wire surface). In model calculations, a bulk body having a thickness of 100 μm can exhibit the same critical current as that of a wire (REBCO layer) having a thickness of 1 μm, but a thickness of about several mm is sufficient for the bulk body 20, even taking into consideration degradation of the surface of the bulk body due to moisture in air. The planar shape of the bulk body 20 is not particularly limited, so long as the length of the shape is enough to cover the REBCO surfaces of the wires 10. The length lies herein in the range of about 2 mm to 200 mm.

FIG. 3 is a flowchart illustrating the flow of the connection process of the REBCO wires. FIG. 3 illustrates a basic flow, although the details of the process vary depending on the structure of the concrete connection body.

Firstly, the REBCO bulk body 20 is prepared (S10). The bulk body 20 may be produced on site or may be sourced commercially. The production method may be a sintering method, an organic acid complex method or the like; the latter method allows obtaining high-purity samples. Preferably, there is performed a thermal treatment for introducing oxygen deficiency in order to lower the melting point of the bulk body 20, as needed.

Also REBCO wires 10 are prepared (S12). Each REBCO wire 10 has a multilayer structure, and hence it is necessary to remove protective layers so that the REBCO layer becomes exposed. There are two methods for exposing the REBCO layer, namely a method in which the REBCO layer 204 is exposed in a state where the latter is attached to the substrate 203, and a method that involves removing the substrate 203 side. In either method, the materials can be properly separated, by virtue of incomplete-restraint thermal stress between materials, when a force is exerted on the end of the REBCO wire having been taken out of liquid nitrogen after undergoing rapid cooling down to cryogenic temperature (77 K) through immersion in the liquid nitrogen. Any of the faces of the REBCO layer 204 can become exposed, depending on the stress direction.

The wires 10 are set on the bulk body 20, in such a manner that the exposed REBCO surface is in contact with the surface of the bulk body 20, and the whole is placed in a heating furnace (S14), with heating up to a temperature equal to or higher than the melting point of the bulk body 20 but lower than the melting point of the wires 10 (S16). The bulk body 20 is brought as a result to a liquid phase state. There is no need to start heating of the wires 10 in a state where the latter have been set beforehand on the bulk body 20, and it suffices herein that the wires 10 be disposed on the bulk body 20 after heating of the bulk body 20. Thereafter, crystal growth takes place, through slow cooling, at the surface of the bulk body 20 that is in contact with the wires 10, using the REBCO of the wires 10 as a seed crystal (S18). Lastly there is performed a thermal treatment for adding oxygen into the REBCO material, in order to recover superconducting performance (S20).

<Examples of the Connection Body and Production Method Thereof>

FIG. 1 is a concrete example of connection between wires 10, but the arrangement of the wires 10 and the bulk body 20 can accommodate several variations. FIG. 4 illustrates arrangements of the wires 10 and the bulk body 20. An explanation follows next on configurations in various embodiments the method for producing the configurations.

Embodiment 1

FIG. 4(a) and FIG. 4(b) are a front-view diagram and a top-view diagram of a connection body according to Embodiment 1. In Embodiment 1 the wires 10a, 10b are connected to the top surface of the bulk body 20. In Embodiment 1, connection of the wires 10 can be elicited through heating of the top of the bulk body 20 to melt only the necessary region in part of the body 20. Partial heating is accomplished herein simply using a micro-torch with gas flame, or using infrared rays, high-frequency heating, a small electric furnace, or using some other kind of heater. The connection angle of the wires 10a, 10b is not particularly limited, and in addition to being lined up along a straight line, as illustrated in FIG. 4(b), the wires 10a, 10b can form a right angle as illustrated in FIG. 4(c), may be disposed pointing in the same direction as illustrated in FIG. 4(d), or may be disposed at any angle other than those of FIG. 4(c) and FIG. 4(d).

The method for producing the connection body according to Embodiment 1 will be explained next. Firstly, the temperature is raised to a temperature equal to or higher than the melting point of the bulk body 20 but lower than the melting point of the wires 10. The highest temperature is determined depending on the bulk body 20 and the wires 10, but lies in the range of about 700° C. to 1400° C. The temperature rise rate must be such that no cracks occur in the bulk body 20. Preferably, the temperature rise rate is set to 50 to 10000° C./h, and in cases where the size of the bulk body 20 exceeds 1000 mm$^3$, preferably to 100 to 300° C./h.

A temperature holding process need not necessarily be provided herein, but in a case where the size of the bulk body 20 exceeds 1000 mm$^3$ it is preferable to provide a temperature holding process in an annealing process (crystal growth process), before the highest temperature is reached and after the highest temperature is reached.

The bulk body 20 can be made into a good bulk body, with high purity of the 123 phase (RE'Ba$_2$Cu$_3$O$_{7-\delta}$), through one-time holding of the temperature before phase transition at the melting point, i.e. before reaching of the highest temperature. The bulk body 20 has the superconducting 123 phase and the non-superconducting 211 phase. A bulk having high purity of the 123 phase can be produced herein at a temperature before the melting point of the 123 phase. When the melting point is exceeded the 211 phase appears and the bulk body 20 takes on a two-phase structure. It is difficult to revert to the 123 phase a portion having turned into the 211 phase, and the 123 phase must be melted during connection. Therefore, it is preferable to increase the 123 phase as much as possible by providing a one-time temperature holding step before the melting point is reached. Even if no temperature holding process is provided, the same effect can be achieved by slowing down the temperature rise rate.

Providing thus a temperature holding process at the highest temperature allows melting the bulk body 20 sufficiently, to which end about several hours are sufficient.

In a temperature lowering process, crystal growth between bulk body 20 and the wires 10 takes place over a very short time. Therefore, although providing a separate firing process for crystal growth is not essential herein, it is preferable to provide a firing period (annealing process) of lowering gradually the temperature, in order to enhance connection strength and aligning crystal orientations in the bulk body 20. For instance, the temperature range may be set to lie in the range of 1200° C. to 800° C., and the time to be 1 week or less. Providing the temperature holding process in the annealing process is preferable for the following reasons. The bulk body 20 is generated through powder-compacting and heating of starting materials, and hence contains ordinarily a large amount of voids (holes). Oxygen escapes when the bulk body 20 is heated in air, while bubbles may remain upon cooling immediately after overheating up to the melting point. By providing a temperature holding process, the bulk body 20 can be imparted with an integral structure having no holes between particles. Further, a dense structure is achieved through gradual easing of the rate of oxygen escape. A uniform crystal is thus obtained by providing a temperature holding step.

In the case of the present embodiment, firing may be initiated after the wires 10 have been disposed beforehand on the bulk body 20; alternatively, the wires 10 may be disposed on the bulk body 20 after firing has started. In a case where firing is initiated with the wires 10 having been disposed beforehand, it is preferable to set the highest temperature to be high, so that the bulk body 20 melts reliably. In a case where a method that involves arranging the wires 10 halfway during heating is utilized in a bulk body having a thickness of 5 mm or greater, the highest temperature is preferably set to be higher than the melting point of the bulk body 20, and there is provided a process of, after reaching of the highest temperature, holding a temperature close to the melting point temperature of the bulk body 20 but lower than the highest temperature, and arranging the wires 10 on the bulk body 20 during the temperature holding process. The bulk body 20 may be heated up to or above the melting point of the wires 10, so long as heating takes place before the wires 10 are disposed on the bulk body 20.

An explanation follows next on a substrate for supporting the wires 10 and the bulk body 20 during the thermal treatment. In a case where the thickness of the bulk body 20 is 5 mm or greater, only the surface portion of the bulk body 20 is melted, while the bottom face of the latter remains as a solid phase. Accordingly, it is preferable to provide a substrate (bulk body support substrate) that supports only part of the bulk body 20. In FIG. 5(*a*), which is a bottom-view diagram of the connection body during the thermal treatment, there are disposed bulk body support substrates 51. For instance, ordinary alumina may be used in the bulk body support substrates 51. The bulk body support substrates 51 reduce thermal diffusion from the bulk body 20, and hinder crystal growth other than that of the 123 phase (main-component $REBa_2Cu_3O_{7-\delta}$ phase) through contact with the substrates 51. The number of support substrates 51 in FIG. 5(*a*) is three, but that number may be any number.

In a case where the bulk body 20 is to be turned into a liquid phase down to the bottom face, the bulk body 20 must be disposed on a substrate that is larger than the bulk body 20.

A substrate for supporting the wires 10 is necessary in a case where the length of the bulk body 20 in the wire longitudinal direction is not that large and the bulk body 20 cannot sufficiently support the wires 10. The purpose of this substrate is to prevent deformation of the wires 10 as a whole accompanying the softening of the metal substrate material in the wires 10 during the thermal treatment. FIG. 5(*b*) is a front-view diagram of the connection body during the thermal treatment. Herein, the wire support substrates 52 of height identical to that of the bulk body 20 are disposed in the vicinity of the bulk body 20, to support the wires 10. As a result it becomes possible to prevent permanent curved distortion of the wires 10 due to the heating treatment.

Embodiment 2

FIG. 4(*e*) and FIG. 4(*f*) are a front-view diagram and a top-view diagram of a connection body according to Embodiment 2. In Embodiment 2 the wires 10*a*, 10*b* are disposed on the bulk body 20 and there is performed a thermal treatment for connection. As compared with Embodiment 1, Embodiment 2 is advantageous in that the bulk body 20 can be produced in a very short time and no substrate is required for supporting the wires 10, through a reduction in the amount (volume) of the bulk body 20.

The temperature profile at the time of the thermal treatment is basically the same. However, the amount of the bulk body 20 can be reduced herein, and hence the overall firing time can be likewise shortened. In particular, the thermal treatment time required for connection may range from several minutes to several days.

In the present embodiment, preferably, the thermal treatment is initiated in a state where the bulk body 20 is disposed on the wires 10. It suffices herein to place the entirety of the wires 10 and the bulk body 20 on a substrate larger than the foregoing and perform then a thermal treatment, and thus no other support substrate is required.

Embodiment 3

FIG. 4(*g*) and FIG. 4(*h*) are a front-view diagram and a side-view diagram of a connection body according to Embodiment 3. In Embodiment 3 the wire 10*a* and the wire 10*b* are disposed on different faces of the bulk body 20 and there is performed a thermal treatment for connection. The present embodiment as well, similarly to Embodiment 2, is advantageous as compared with Embodiment 1 in that the bulk body 20 can be produced in a very short time and no substrate is required for supporting the wires 10, through a reduction in the amount (volume) of the bulk body 20.

EXAMPLES

One wire and one bulk body were actually connected in order to check the connection performance of the REBCO wires and the REBCO bulk body in the connection method according to the present invention. The specific procedure and connection performance are explained next.

(Used Materials)

The materials used will be explained first. Herein Super Power SCS4050 by FURUKAWA ELECTRIC CO., LTD. were prepared as the REBCO wire 10. The wire, which has the structure illustrated in FIG. 2, has a width of 4 mm and a thickness of 0.1 mm. The REBCO layer of the wire contains mainly Gd as the rare earth element, and contains also Y. The melting point of the REBCO layer is about 1050° C.-1100° C.

The REBCO bulk body 20 is a bulk body of YBCO produced through sintering of powder starting material of $Y_2O_3$, $BaCO_3$ and CuO. The procedure for producing YBCO is well known, and will not be explained in detail herein. The purity of the REBCO (YBCO) bulk body 20 used in the experiment is about 70%, and the bulk body 20 has a round shape with a diameter of 50 mm and a thickness of 30 mm. The melting point of the bulk body 20 is about 1000° C. in air. The bulk body was used as it was, in an oxygen-deficient state, without performing an oxygen addition heating treatment on account of oxygen deficiency, in the production process of bulks that are ordinarily commercially available.

(Production Procedure)

In broad terms, the production procedure includes four stages, namely wire pretreatment, thermal treatment for connection, thermal treatment for oxygen addition, and thermal treatment in a shape processing treatment. The respective steps are explained next.

1. Wire Pretreatment

Pretreatment of the wire 10 will be explained first. A wire having a length of 100 mm is prepared, and then Cu at both edges in the width direction is cut off by about 0.2 mm. The wire was quickly cooled through immersion in liquid nitrogen (77 K); after 1 minute, the wire was retrieved at normal temperature, and then the ends were immediately stripped off in the longitudinal direction. The REBCO layer 204 and the substrate 203 peeled off from each other, with the REBCO layer 204 becoming exposed while attached to the Cu layer 201 side. In the 100 mm wire, 25 mm were cut out from a portion where the REBCO layer was neatly exposed, and the cut portion was used in the experiment below.

2. Thermal Treatment for Connection (Crystal Growth)

A thermal treatment for connection (crystal growth) will be explained next. Firstly, bulk body support substrates 51 such as those illustrated in FIG. 5(*a*) are disposed in an electric furnace, at normal temperature prior to the start of firing, and the bulk body 20 is disposed in such a manner that the center of the latter is positioned in the middle of the bulk body support substrates 51. The material of all the support substrates 51 is alumina. The wire 10 is not placed in the electric furnace at this point in time.

Firing was performed in an air atmosphere, according to the temperature profile illustrated in FIG. 6. The temperature was raised up to 980° C., after which the temperature rise rate was lowered, with heating up to 1010° C. The temperature raising process from 980° C. to 1010° C. is a substitute for the temperature holding process before reaching of the highest temperature. As a result there is obtained a bulk body 20 of good quality having a high 123 phase purity. Thereafter, the bulk body 20 was heated up to 1170° C. (highest temperature) being equal to or higher than the melting point of the bulk body 20, and the temperature was held for 1 hour, to elicit as a result sufficient melting of the surface of the bulk body 20. Thereafter, the exposed surface of the REBCO layer of the wire 10 was laid the top surface of the bulk body 20, at 1040° C., which is equal to or higher than the melting point of the bulk body 20 and equal to or lower than the melting point of the wires 10. In this state, crystal growth on the top face of the bulk body 20 was elicited through an annealing process that involved lowering gradually the temperature from 1000° C. down to 980° over 72 hours. A temperature holding process at 900° C. for 24 hours is provided after the annealing process. The crystal growth step (annealing process and subsequent temperature holding process) was set in this experiment to a sufficient time of about 96 hours; the overall thermal treatment took about 140 hours.

3. Thermal Treatment for Oxygen Addition

A thermal treatment for adding oxygen is carried out in order to improve the superconducting characteristics of REBCO. Herein there was carried out a thermal treatment at 450° C. for 100 hours in an oxygen atmosphere.

4. Shape Processing Treatment

In the shape processing treatment, unwanted bulk body 20 is removed, and the bulk body 20 is worked to a shape having substantially the width of the wires 10. Herein the bulk body 20 was milled to a width of 7 mm, close to the width of the wires 10, and to a thickness of about 3 mm. The shape processing treatment is a step that can be omitted; but if carried out, the shape processing treatment may be performed before the thermal treatment for oxygen addition.

(Sample Evaluation)

FIGS. 7(*a*) and 7(*b*) illustrate produced samples (before shape processing). FIG. 7(*a*) is an overall diagram of the sample, and FIG. 7(*b*) is an enlarged-view diagram. Sample evaluation involved microstructure observation, X-ray diffraction measurements, and assessment of mechanical characteristics and electrical characteristics.

1. Microstructure Observation

FIG. 8 illustrates the fine structure of the connection body by a 3D digital microscope. In the figure, the dashed line denotes the boundary line between the wire (REBCO layer) and the bulk. FIG. 8(*a*) is a 3D composite micrograph of the surface (top in the figure) and the cross-section (bottom in the figure) of the connecting portion, and FIG. 8(*b*) is an enlarged-view diagram of the cross-section of the connecting portion. FIG. 8(*a*) reveals that the connection portion adopts a gently sloped structure in which the boundary line between the wire and the bulk, at the surface of the connecting portion, is difficult to distinguish. This indicates that the wire is sufficiently connected to the bulk in a direction parallel to a tape surface, and that conditions for crystal growth are satisfied in the direction parallel to the tape surface. The cross-sectional diagrams in FIG. 8(*a*) and FIG. 8(*b*) reveal that there is no distinct boundary line between the wire and the bulk. That is, the molten bulk as a whole becomes connected to, and integrated with, the REBCO layer of the wires, due to crystal growth, thus creating sufficient superconducting current paths at the connecting portions while exhibiting high mechanical strength.

2. X-Ray Diffraction Measurement

FIG. 9 illustrates X-ray diffraction measurement results. The YBCO bulk used herein has about 25% of Y211 phase, other than the main Y123 phase, mixed into the bulk, and hence Y211 peaks appear in the X-ray diffraction measurement results of FIG. 9. In the pattern of the Y123 phase, the 013, 103 and 110 peak intensities are characteristically highest in X-ray diffraction measurement results of a powder sample. By contrast, such peaks do not appear for a bulk surface, in which case only 00L peaks (003, 005, 006 and 007) appear. This clearly indicates that crystal growth progresses to yield a single domain at the bulk surface. In FIG. 7(*b*) there appear lines denoting crystal growth from the surface of the bulk.

3. Mechanical Characteristics

It is deemed that connection between the REBCO layers of wires and the bulk due to crystal growth results in and crystalline connection between of very high quality between the foregoing and in very high connection strength. In the present example as well, the connection strength between the wire 10 and the bulk body 20 was very high, in that the wire could not be detached from the bulk surface even under application of 500 MPa tensile stress along the connection surface.

4. Electrical Characteristics

To evaluate the electrical characteristics of the connecting portion between the wire and the bulk, firstly the center of the wire was ground using a file, to separate the wire into two wires separated by a space 1 mm wide therebetween. In the configuration illustrated in FIG. 10(a), current terminals were soldered to the two wires, and the electrical resistance of the connection body in liquid nitrogen (77 K) was measured while current was caused to flow. Herein there can be measured the electrical resistance of the connecting portion between wire voltage terminals 101 and 102, the electrical resistance of the wires after heating, between voltage terminals 102 and 103, and the electrical resistance of the bulk, between voltage terminals 104 and 105.

The measurement procedure will be explained in detail next. Firstly, respective leads 106, 107 for causing current to flow in the connection body are connected to the wires. REBCO wires were used in the leads. Leads 106 and 107 are connected the surface (Cu stabilizing layer) of the two wires, but are not connected directly to the bulk surface. The leads were connected through ultrasonic soldering, at a spacing of 15 mm. The spacing between voltage taps 101 and 102, between voltage taps 102 and 103 and between voltage taps 104 and 105 was 5 mm. Soldering was performed between leads 106 and 107.

Firstly, voltage was measured simultaneously between voltage taps 102 and 103, and between voltage taps 104 and 105, while increasing the current flowing between leads 106 and 107 at a rate of 10 A/min. Next, the voltage between voltage taps 101 and 102 was measured simultaneously while further increasing, slowly, the current flowing between leads 106 and 107, at a rate of 4 A/minute. The obtained results are illustrated in FIG. 10(b).

The connecting portions, the wires and the bulk all exhibited superconduction, with critical currents of 10 A, 16 A, 30 A, respectively. The length of the connecting portions is 1 cm, and hence the critical current per unit length of the connection body is 1000 A/m. The present experiment demonstrated the effectiveness of REBCO wire connection by crystal growth via a bulk body.

In the connection according to the present procedure sufficient connection strength is obtained since crystal growth is resorted to. Further, the bulk body undergoes crystal growth using a solid-phase REBCO layer as a seed crystal, and hence the crystal orientations of the REBCO layers of the wires and the bulk body are aligned with each other. A larger superconducting current can be caused to flow as a result. A further advantage is that the time taken by the thermal treatment for connection is relatively short. The melt diffusion method proposed in PTL 1 requires a production time of about several months in order to recover the superconducting performance of the REBCO layers of wires molten in a connection process. In the present technique, by contrast, connection can be accomplished in one week or less. Although shortening of process time is not pursued in the above experiment, process time can be further shortened by tweaking the shape (size and so forth) of the bulk body and/or the arrangement method of the wires.

INDUSTRIAL APPLICABILITY

The present invention can be used in order to connect, with low resistance, a high-temperature superconducting wire and a high-temperature superconducting bulk body, and can be used to connect, with low resistance, two high-temperature superconducting wires by way of a high-temperature superconducting bulk body. The present invention can be used in order to produce a high-temperature superconducting wire that is long enough to be used for developing any superconducting magnet (superconducting coil), and can be used, in particular, in application equipment where operation in a persistent current mode is required, for instance in MRI and NMR equipment.

REFERENCE SIGNS LIST 10a, 10b REBCO wire (high-temperature superconducting wire)
20 REBCO bulk body (high-temperature superconducting bulk body)

The invention claimed is:

1. A low-resistance connection body for a high-temperature superconducting wire, in which a high-temperature superconducting bulk body and a high-temperature superconducting wire including a high-temperature superconducting layer are connected to each other, wherein
    a melting point of the high-temperature superconducting layer comprising $REBa_2Cu_3O_{7-\delta}$ is higher than a melting point of the high-temperature superconducting bulk body comprising $RE'Ba_2Cu_3O_{7-\delta}$, each of RE and RE' being one or a plurality of rare earth elements, and an element or composition of RE' being different from that of RE;
    the high-temperature superconducting layer and the high-temperature superconducting bulk body are in contact at a connection site of the high-temperature superconducting wire and the high-temperature superconducting bulk body; and
    a surface of the high-temperature superconducting bulk body that is in contact with the high-temperature superconducting layer is crystallized into single crystal, and other portions of the high-temperature superconducting bulk body is crystallized into polycrystal due to crystal growth.

2. The low-resistance connection body for a high-temperature superconducting wire according to claim 1, wherein the superconducting bulk body comprises RE'123 phase and RE' 211 phase.

3. The low-resistance connection body for a high-temperature superconducting wire according to claim 1, wherein the high-temperature superconducting wire comprises a stack of a substrate, the high-temperature superconducting layer, and a protection layer.

4. A low-resistance connection body for a high-temperature superconducting wire, in which a first high-temperature superconducting wire including a first high-temperature superconducting layer comprising $RE^1Ba_2Cu_3O_{7-\delta}$ and a second high-temperature superconducting wire including a second high-temperature superconducting layer comprising $RE^2Ba_2Cu_3O_{7-\delta}$ are connected to each other via a high-temperature superconducting bulk body comprising $RE'Ba_2Cu_3O_{7-\delta}$, wherein each of $RE^1$, $RE^2$, and RE' being one or a plurality of rare earth elements, and an element or composition of RE' being different from that of $RE^1$ or $RE^2$;

melting points of the first and second high-temperature superconducting layers are higher than a melting point of the high-temperature superconducting bulk body;

the first and second high-temperature superconducting layers and the high-temperature superconducting bulk body are in contact at connection sites of the first high-temperature superconducting wire and the second high-temperature superconducting layer of the second high-temperature superconducting wire and the high-temperature superconducting bulk body; and surfaces of the high-temperature superconducting bulk body that are in contact with the first and second high-temperature superconducting layers are crystallized into single crystal, and other portions of the high-temperature superconducting bulk body is crystallized into polycrystal due to crystal growth.

5. The low-resistance connection body for a high-temperature superconducting wire according to claim 4, wherein the first high-temperature superconducting layer of the first high-temperature superconducting wire and the second high-temperature superconducting layer of the second high-temperature superconducting wire are connected at a same surface of the high-temperature superconducting bulk body.

6. The low-resistance connection body for a high-temperature superconducting wire according to claim 4, wherein the first high-temperature superconducting layer of the first high-temperature superconducting wire and the second high-temperature superconducting layer of the second high-temperature superconducting wire are connected at different surfaces of the high-temperature superconducting bulk body.

7. The low-resistance connection body for a high-temperature superconducting wire according to claim 4, wherein the first high-temperature superconducting layer of the first high-temperature superconducting wire and the second high-temperature superconducting layer of the second high-temperature superconducting wire are connected at the same surface of the high-temperature superconducting bulk body.

8. The low-resistance connection body for a high-temperature superconducting wire according to claim 4, wherein the first high-temperature superconducting layer of the first high-temperature superconducting wire and the second high-temperature superconducting layer of the second high-temperature superconducting wire are connected at different surfaces of the high-temperature superconducting bulk body.

9. The low-resistance connection body for a high-temperature superconducting wire according to claim 4, wherein the superconducting bulk body comprises RE'123 phase and RE' 211 phase.

10. The low-resistance connection body for a high-temperature superconducting wire according to claim 4, wherein each of the first high-temperature superconducting wire and the second high-temperature superconducting wire comprises a stack of a substrate, a high-temperature superconducting layer, and a protection layer.

11. A low-resistance connection method for a high-temperature superconducting wire, for connecting a high-temperature superconducting wire including a high-temperature superconducting layer with a high-temperature superconducting bulk body, the melting point of which is lower than that of the high-temperature superconducting layer, the method comprising:
a temperature rise step of heating the high-temperature superconducting bulk body comprising $REBa_2Cu_3O_{7-\delta}$ up to a temperature that is equal to or higher than a melting point of the high-temperature superconducting bulk body and lower than a melting point of the high-temperature superconducting layer comprising $RE'Ba_2Cu_3O_{7-\delta}$, each of RE and RE' being one or a plurality of rare earth elements, and an element or composition of RE' being different from that of RE; and a crystal growth step of performing crystal growth on the high-temperature superconducting bulk body in a state where a liquid phase portion of the high-temperature superconducting bulk body and the high-temperature superconducting layer are in contact with each other, the crystal growth leading to a formation of a single crystal at a contact surface of the high-temperature superconducting bulk body and a polycrystal at other portions of the high-temperature superconducting bulk body.

12. A low-resistance connection method for a high-temperature superconducting wire, for connecting a first high-temperature superconducting wire including a first high-temperature superconducting layer comprising $RE^1Ba_2Cu_3O_{7-\delta}$ and a second high-temperature superconducting wire including a second high-temperature superconducting layer comprising $RE^2Ba_2Cu_3O_{7-\delta}$ with a high-temperature superconducting bulk body comprising $RE'Ba_2Cu_3O_{7-\delta}$, the melting point of which is lower than those of the first high-temperature superconducting layer and the second high-temperature superconducting layer, each of $RE^1$, $RE^2$, and RE' being one or a plurality of rare earth elements, and an element or composition of RE' being different from that of $RE^1$ or $RE^2$; the method comprising:

a temperature rise step of heating the high-temperature superconducting bulk body up to a temperature that is equal to or higher than a melting point of the high-temperature superconducting bulk body and lower than melting points of the first and second high-temperature superconducting layers; and a crystal growth step of performing crystal growth on the high-temperature superconducting bulk body in a state where a liquid phase portion of the high-temperature superconducting bulk body and the first and second high-temperature superconducting layers are in contact with each other, the crystal growth leading to a formation of a single crystal at contact surfaces of the high-temperature superconducting bulk body and a polycrystal at other portions of the high-temperature superconducting bulk body.

* * * * *